Feb. 25, 1964 L. J. MATTINGLY 3,122,708

GAIN CONTROLLED FREQUENCY DETECTOR SYSTEM MODULATION

Filed Nov. 9, 1960

INVENTOR.
LAWRENCE J. MATTINGLY
BY Mueller & Aichele
ATTYS.

3,122,708
Patented Feb. 25, 1964

3,122,708

GAIN CONTROLLED FREQUENCY MODULATION DETECTOR SYSTEM

Lawrence J. Mattingly, Lombard, Ill., assignor to Motorola, Inc., Chicago, Ill., a corporation of Illinois Filed Nov. 9, 1960, Ser. No. 68,208
4 Claims. (Cl. 329—169)

Figure 1:
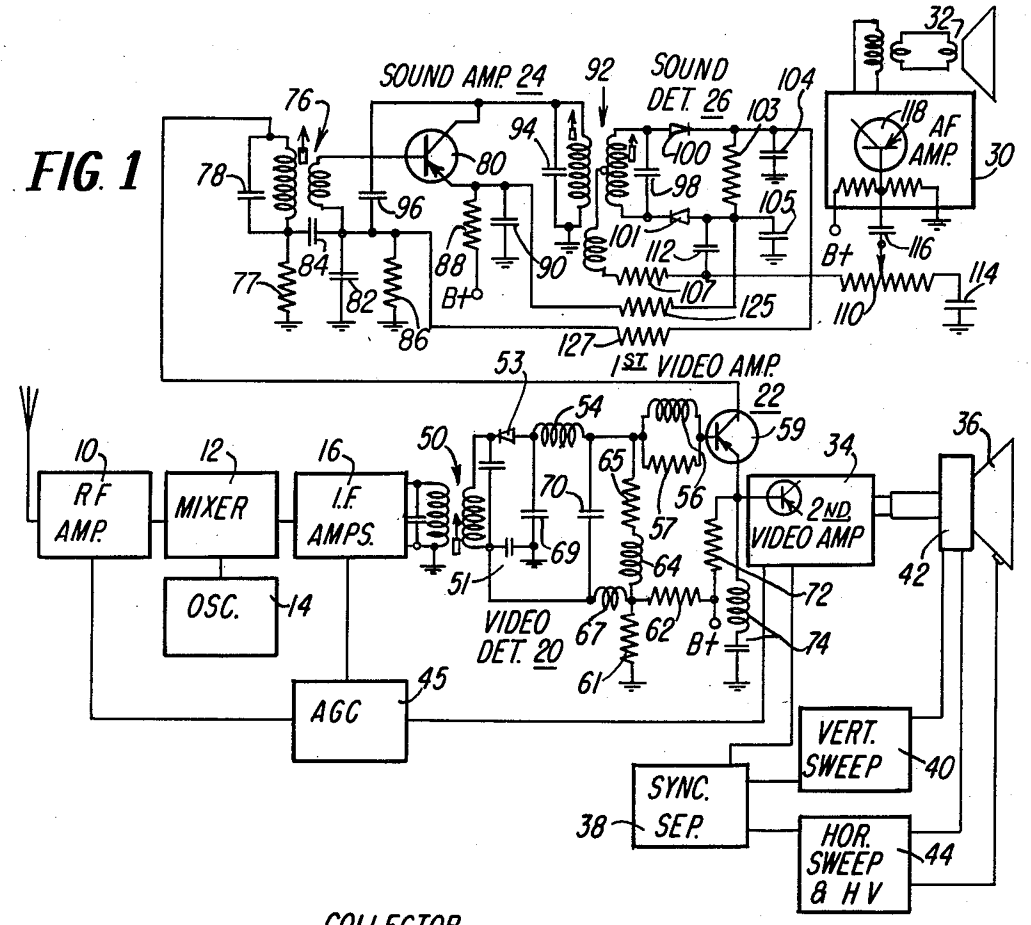

This invention relates to receiver systems and more particularly to a demodulating circuit for frequency modulation signals which is especially useful as a sound signal detector in a transistorized television receiver.

In many forms of frequency modulation detectors the circuit must be designed to operate over a very wide range of input signal levels. For example, in television receivers, the frequency modulation sound subcarrier, generally at a frequency spaced 4.5 megacycles from the main video carrier, can vary widely in amplitude as the receiver is fine tuned. That is the sound signal may fall anywhere from the maximum response of the intermediate frequency pass band to a region of great attenuation within the pass band. Overdrive of a transistor used as a sound IF amplifier can lead to introduction of distortion in the demodulated signal and undesirable amplitude modulation of the FM signal, or even oscillation of the system. While the usual limiter circuit can precede an FM detector circuit, a limiter generally has the disadvantage of poor signal gain for low level signals.

It is accordingly an object of this invention to increase the range of signal levels which can be satisfactorily demodulated in a frequency modulation detector system.

It is another object to reduce instability and distortion in transistorized frequency modulation detector systems.

Another object is to provide an improved transistorized sound detector circuit for a television receiver which is stabilized for high gain of low level signals and automatically gain controlled for limiting of high level signals.

A feature of the invention is the provision of a frequency modulation detector system providing a direct current potential related to the signal level therein and means for applying such potential between the emitter and base electrodes of a driver transistor for operating such driver as an amplifier of weak signals or a limiter for strong signals.

Another feature is the provision of such a detector system in which the driver stage for the detector includes an inverse feedback network between the collector and base circuits for improving isolation between the input and output circuits and improving stabilized high gain operation of the detector system.

Figure 2:
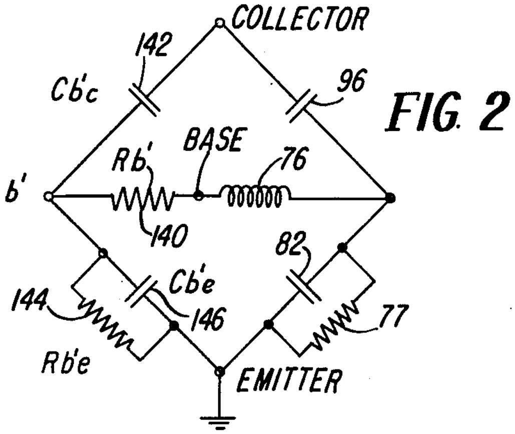

In the drawing:

FIG. 1 is a diagram partly schematic and partly in block of a transistorized television receiver utilizing the frequency modulation detecting system of the invention; and FIG. 2 is a schematic diagram illustrating an equivalent circuit useful in explaining the operation of the system.

In a specific form, the invention provides a transistorized sound detector system for a television receiver. A video amplifier in the receiver provides the sound subcarrier from the video detector and this sound subcarrier is coupled to a sound intermediate frequency amplifier, or driver, for a passive detector in the receiver. A portion of the output signal of the driver stage is applied from the collector of the driver transistor through a capacitor to a further capacitor connected in series with the base input signal source of the transistor to provide stabilizing inverse feedback in the driver stage. The capacitors are selected to form a balanced bridge for neutralization of the collector-base interelectrode capacity for stabilizing the system to improve high gain operation. The ratio detector is effectively referenced to the emitter potential of the driver transistor and a load resistor of the detector is direct current connected to the base circuit of the driver transistor. The quiescent bias for the driver and transistor electrodes is adjusted so that under low level signal conditions the transistor is biased by the ratio detector for high gain and under high level signal conditions the driver is actually reverse biased beyond cutoff and driven from cutoff to saturation by the signal to form an effective limiter circuit for driving the ratio detector.

Referring now to FIG. 1, the illustrated television receiver may be a battery operated type and all transistorized except for the picture tube and high voltage rectifier. The receiver includes a tuner comprising an RF amplifier stage 10, a mixer stage 12, and an oscillator 14. The tuner selects a particular television signal and converts the same to a signal of fixed intermediate frequency for further amplification in the IF amplifiers 16. Amplifiers 16 are connected to the video detector 20 which demodulates a received composite video signal having line and frame synchronizing components, video frequency components, and a modulated sound subcarrier. The demodulated television signal is applied to the first video amplifier 22 from which is derived the sound subcarrier, generator frequency of 4.5 megacycles, and this signal is applied to the sound amplifier 24. The sound signal is then coupled to the sound detector 26 which demodulates the FM sound signal and applies the resulting audio frequency signal to the audio frequency amplifier 30. Amplifier 30 is connected to a loudspeaker 32 for reproducing the sound.

The demodulated composite video signal is also applied from the first video amplifier 22 to a second video amplifier 34 and from amplifier 34 to the cathode ray picture tube 36. Tube 36 reproduces the video frequency components of the signal to produce the resultant image of the televised scene. The synchronizing signal separator 38 is connected to video amplifier 34 and this circuit separates the line and frame synchronizing signal components from the composite video signal. The frame or vertical synchronizing signals, generally at 60 cycles, are then applied to the vertical sweep circuit 40 which develops a suitable sawtooth scanning current in a deflection yoke 42 which is disposed on the neck of cathode ray tube 36. The separator circuit 38 is also connected to the horizontal sweep and high voltage circuit 44 which provides line or horizontal signals, generally at 15.75 kc., in the form of sawtooth scanning currents in the deflection yoke 42. The circuit 44 also provides a high voltage of the order of 15 kv. for the screen of cathode ray tube 36.

The second video amplifier 34 supplies a signal proportional to the strength of the detected video carrier to the AGC system 45, which is D.C. coupled through the video stages to detector 20. The AGC system 45 is connected to the RF amplifier 10 and the IF amplifier 16 in order to regulate the gain of these stages in accordance with the strength of a received signal in order to provide a uniform input signal level to the video detector 20.

It will be recognized by those skilled in the art that the preceding general description of the television receiver of FIG. 1 refers to the overall circuit functions in general terms. While in a specific transistorized television receiver as being discussed, some ofthe above mentioned circuits will be non-standard it will be appreciated that the end result of the different circuits will be comparable to that of the corresponding vacuum tube circuits, the operation of which is well understood in the art. Accordingly, further detailed description of these circuits as presented in block form in FIG. 1 is believed unnecessary and the remaining description herein will relate specifically to the construction and operation of the sound signal detecting system of the receiver. Reference will be made to frequency modulated signals to describe the modulated sound subcarrier of the composite television signal, but it will be understood that this designation also may include phase modulated signals.

Considering now the particular circuit connections in the system of FIG. 1, the final stage of IF amplifier 16 is coupled through transformer 50 to the video detector 20. One side of the secondary winding of transformer 50 is bypassed to ground at signal frequencies through capacitor 51, the other side of the secondary winding is connected to the cathode of a diode 53. The anode of diode 53 is connected through the choke 54 and the parallel combination of choke 56 and resistor 57 to the base electrode of transistor 59. Base bias for the transistor 59 is formed at the junction of resistors 61 and 62 which are series connected respectively between ground and B+. The junction of these resistors is coupled through the peaking coil 64 and the resistor 65 to the interconnection of chokes 54 and 56. A further choke 67 is connected between the junction of resistors 61, 62 and the signal grounded terminal of the secondary winding transformer 50. A capacitor 69 is connected between the junction of diode 53 and choke 54 and ground. A further filter capacitor 70 is connected between the junction of chokes 54, 56 and the junction of capacitor 51 and choke 67.

Transistor 59 which is included in the first video amplifier 22 has an emitter electrode which is series connected with resistor 72 to B+. The emitter is also connected through the series tuned circuit 74 to ground. Tuned circuit 74 is resonant at 4.5 megacycles in order to effectively ground the emitter for the sound subcarrier so that transistor 59 operates as a common emitter amplifier for this signal. It will also be seen that the emitter electrode is directly connected to the base electrode of a transistor in the second video amplifier 34. Since the resonant circuit 74 will have considerable impedance at the frequency of the video signal components, these are developed at the emitter electrode to be applied to the second video amplifier 34. The collector electrode of transistor 59 is connected in series to the primary winding of coupling transformer 76 and the resistor 77 to ground. The primary winding of transformer 76 is parallel tuned by means of capacitor 78. This tuned circuit is used to develop the sound subcarrier for application to the sound IF amplifier 24.

The sound subcarrier frequency 4.5 megacycles is developed across the secondary winding of transformer 76 which is connected to the base electrode of transistor 80 and the sound amplifier 24. Another terminal of the transformer secondary winding is coupled through a capacitor 82 to ground. Capacitor 84 is also coupled from this terminal of the secondary winding to the junction of the primary winding and resistor 77. Capacitor 84 has a low impedance at signal frequencies. A base bias resistor 86 is connected across the capacitor 82.

The emitter electrode of transistor 80 is connected through resistor 88 to B+ in order to provide bias for this electrode and the emitter is also bypassed to ground by means of capacitor 90. Output signals are derived at the collector electrode of transistor 80 which is series connected to ground through the primary winding of coupling transformer 92. This primary winding is tuned by means of capacitor 94. The collector electrode of transistor 80 is also coupled through a small coupling capacitor 96 to the junction of capacitor 82 and the secondary winding of transformer 76. The operation of the feedback network including capacitors 82 and 96 will be explained subsequently.

The sound subcarrier is developed across the secondary winding of transformer 92 which is tuned by means of capacitor 98. One terminal of the transformer secondary winding is connected to the anode of diode 100 and the other terminal is connected to the cathode of diode 101.

The cathode of diode 100 and the anode of diode 101 are interconnected through the load resistor 103 and the terminals of this resistor are bypassed to ground for audio frequencies by means of capacitors 104 and 105.

The tertiary winding of detector transformer 92 is inductively coupled very closely with the primary winding, and it is connected from a center tap of the secondary winding through the resistor 107 to one side of a volume control potentiometer 110. The junction of potentiometer 110 and resistor 107 is bypassed for radio frequencies through capacitor 112 to the junction of resistor 103 and capacitor 105. It will be recognized that the sound detector 26 is in the form of an unbalanced ratio detector in which equal signal voltages of opposite polarity are applied to the diodes 100, 101 and the signal induced in the tertiary winding of the transformer 92 is applied in parallel to these diodes. As the frequency of the applied signal varies, the phase angle between the two signal components applied to the diodes varies due to secondary tuning and the instantaneous amplitudes of signals applied to the diodes changes at the modulation rate. The resulting difference in conduction of the two diodes provides a signal at the junction of resistor 107 and capacitor 112 which is a function of the modulation of a FM subcarrier signal.

A further fixed terminal of potentiometer 110 is grounded through capacitor 114 for audio frequencies and the variable arm of the potentiometer 110 is connected through coupling capacitor 116 to the base electrode of the audio frequency amplifier transistor 118. It should be understood that additional circuits will be included in the audio frequency amplifier stage 30 in order to amplify the detected audio signal to sufficient power to drive loudspeaker 32 and that this amplifying circuit may be of known construction.

It will be recognized that in a television receiver as described the level of the sound signal may vary widely during use of the receiver. This can occur as a difficult problem due to adjustment of the fine tuning of a television receiver. For example, generally the frequency of oscillator 14 is varied by the user of the receiver to change slightly the frequency position of the incoming signal with respect to the pass band of the IF amplifier 16. By this operation it is possible to either position the sound subcarrier at or near the maximum response of the amplifier 16 or at various other positions along one side of the decreasing response of these amplifiers. In a practical situation fine tuning may result in a variation of 50 db in the level of the sound signal applied to the detector 26.

Ideally the signal applied to driver transistor 80 should be maintained below an amplitude which would cause overdrive and instability thereof. However, in a practical situation the signal may vary from a level at which some amplification is necessary for proper operation of the audio system and throughout a range extending to high signal levels at which the transistor 80 would be overdriven thereby causing instability in the amplifier stage 24. The most effective operation of the transistor 80 would be at a signal level wherein the transistor would be operated from cutoff and driven into conduction by the input signal at its base. Under these conditions the input signal level which could successfully be handled without reversal of the collector base diode would be maximized. However, this type of operation would minimize any signal gain for low level signals since the transistor would be operated very close to cutoff. Thus, a dynamic biasing arrangement should be utilized in order to forward bias transistor 80 for weak signals and reverse bias the transistor for strong signals. This is accomplished in the present circuit by effectively "floating" the ratio type sound detector 26 at the emitter potential of the driver transistor 80 and deriving a dynamic base electrode bias for transistor 80 from the positive potential available from the detector load resistor.

To obtain the above described operation, a resistor 125 is connected between the anode of diode 101 and the emitter of transistor 80. A resistor 127 is also connected between the cathode of diode 100 and the junction of resistor 86 with the secondary winding of transformer 56. Accordingly, resistor 127 is direct current connected through the secondary winding to the base electrode of transistor 80. It will be observed that since the detector 26 is not otherwise direct current connected to ground, it will be referenced to the emitter potential of transistor 80. The positive direct current voltage appearing across resistor load 103, which voltage is proportional to the level of the signal being detected, will be applied through the base electrode transistor 80 to the resistor 127 as a bias control voltage therefor. A circuit of practical construction can provide a small forward bias voltage of approximately .2 volt with the base more negative than the emitter for relatively weak signals. However, as the signal strength is increased, this bias potential will be reversed and may rise to one volt with the base positive with respect to the emitter.

In a dynamic biasing arrangement as described there may be some adverse effect of the tuning of transformer 76 with such relatively wide bias changes on the transistor 80. Any tendency for detuning can be offset by tuning the transformer 76 somewhat broader than normally, and while this may adversely influence the matching of this tuned circuit to the output impedance of the first video amplifier transistor 59, this disadvantage can be offset by the resultant increase of the input impedance of the transistor 59 thereby improving the match of the second detector to the input circuit of the transistor 59.

In the sound amplifier stage 24 a further cause of instability may be due to the relatively poor attenuation characteristics of transistor 80 in a reverse direction and therefore to improve the transistor operation when high gain is required, it is necessary to maximize the isolation between input and output circuits in the amplifier 24. More particularly, oscillation or tendency for instability is overcome in the system of FIG. 1 by means of a degenerative or negative feedback circuit incorporated in the system in the form of a balanced bridge.

In FIG. 2 there is shown an equivalent circuit of a portion of the sound amplifier 24. This equivalent circuit is based on the so-called hybrid-pi equivalent circuit of the transistor 80. FIG. 2 thus represents a common emitter amplifier incorporating negative feedback. As shown there is a resistance 140 in series with a capacitance 142 between the base and collector electrodes of transistor 80. Furthermore, resistance 140 is in series with a further resistance 144 connected in parallel with a capacitance 146 between the base and emitter electrodes. The elements 140–146 represent internal resistances and capacitances of the transistor 80. Externally of the transistor there is capacitor 96 connected between the collector and capacitor 82 and the effective inductance of transformer 76 is connected between the base electrode and the junction of capacitors 96, 82. Capacitor 82 is connected to the emitter of transistor 80 by way of the bypass capacitor 90 which has very low impedance or signal frequencies. Resistor 77 is effectively connected in parallel with capacitor 82 through the very low impedance of the capacitor 84.

The bridge circuit represented in FIG. 2 is brought into balance for the amplifier 24 to neutralize the feedback effect of capacitance 142 by proper election of the values of capacitors 96 and 82. It will be noted that capacitor 96 forms a degenerative feedback path from the collector of transistor 80 and the signal thus fed back will be developed across the capacitor 82 (FIG. 1). The signal appearing across the capacitor 82 and that developed across the secondary winding of transformer 76 are applied between the base and emitter electrodes of transistor 80. With the bridge circuit as shown in FIG. 2 in balance, there will be a marked decrease of the reverse gain of the amplifier 24 so that the reverse gain of the stage can exceed the forward gain thereof in a negative sense by more than 14 db. Under these conditions it has been found that satisfactory isolation of the input and output circuits of the transistor 80 can be obtained thus improving the utilization of the gain possibilities of the transistor.

In a system of practical construction the parts values for the sound amplifier stage 24 were as follows:

| | |
|---|---|
| Resistor 77 | 1,000 ohms. |
| Capacitor 78 | 22 mmfd. |
| Transistor 80 | High frequency Drift type or M.A.D.T. type, e.g. T-1595 (Philco). |
| Capacitor 82 | 270 mmfd. |
| Capacitor 84 | .01 mfd. |
| Resistor 86 | 56,000 ohms. |
| Resistor 88 | 68,000 ohms. |
| Capacitor 90 | .01 mfd. |
| Capacitor 96 | 8.2 mmfd. |
| Resistor 103 | 15,000 ohms. |
| Resistor 125 | 15,000 ohms. |
| Resistor 127 | 1,000 ohms. |
| B+ potential | 12 volts. |

The foregoing invention provides therefore an improved frequency modulation detection system particularly useful in a transistorized television receiver. The invention includes means for improving the detection of signals over a wide signal input range thereby minimizing distortion and tending to maintain proper receiver operation at both low and high signal levels. Furthermore, the system includes provisions for maximizing the amplification of the sound detector driver and minimizing any tendency for instability in that stage.

I claim:

1. A frequency modulation detection system including in combination, a ratio detector including load resistor means, a utilization circuit coupled to said detector for utilizing the demodulated signals therefrom, a signal amplifier providing signals for said detector circuit and including a transistor having input, output and common electrodes, said signal amplifier including means coupling said output electrode to said ratio detector, a direct current circuit connecting said common electrode to one point of said resistor means so that said ratio detector circuit is referenced for direct current potentials to the potential of said common electrode, a second direct current circuit connecting a further point of said resistor means to said input electrode of said transistor for controlling the gain thereof inversely with respect to the level of signals translated thereby and means for applying a fixed bias potential for said transistor across said resistor means.

2. A frequency modulation detection system including in combination, a detector circuit including diode means and a resistor-capacitor network connected thereto, utilization circuit means coupled to said diode means and resistor-capacitor network for translating the demodulated signals, a signal amplifier providing frequency modulation signals for said detector circuit and including a transistor having emitter, base and collector electrodes, means coupling said collector electrode to said diode means, means direct current coupling said base and collector electrodes to said resistor capacitor network for gain control of said transistor, an input impedance and a first capacitor series coupled in the order named between said base and emitter electrodes, means for applying the frequency modulated signals to be demodulated across said input impedance, and a second capacitor connected between said collector electrode and the junction between said input impedance and said first capacitor, said first and second capacitors being selected to form a neutralization bridge with the internal capacitances of said transistor for reducing instability of said signal amplifier.

3. A frequency modulation detection system including in combination, a pair of diodes and tuned reactance means coupled to said diodes to provide a detector circuit for varied conduction thereof in response to frequency variation of a modulated signal to be detected, said detector circuit further including a load circuit having resistor means therein across which appears a control potential directly related to the amplitude of the modulated signal, an audio utilization circuit coupled to said load circuit, circuit means for translating the modulated signal including a driver stage for said detector circuit, said driver stage having a transistor with base, emitter and collector electrodes, means for applying the modulated signal between said base and emitter electrodes, output reactance means coupled to said collector electrode and said tuned reactance means, means for applying direct current bias potentials to said base, emitter and collector electrodes, and a direct current circuit coupling said resistor means of said detector load circuit between said base and emitter electrodes with a polarity of the control potential to bias said transistor for reduced signal gain therein with increase in level of the modulated signal.

4. A frequency modulation detection system for detecting the sound signal in a television receiver, including in combination, rectifier means and tuned reactance means coupled thereto to provide varied conduction in response to frequency variation of a modulated sound signal to be detected, a load circuit connected to said rectifier means and having first resistor means therein across which appears a control potential directly related to the amplitude of the modulated sound signal, an audio utilization circuit coupled to said load circuit, circuit means for translating the modulated sound signal and including a sound driver stage for said rectifier means, said driver stage having a transistor with base, emitter and collector electrodes, means for applying the modulated sound signal between said base and emitter electrodes, output coupling means coupled to said collector electrode and to said tuned reactance means, second resistor means connected to said first resistor means and forming a voltage divider therewith, means connecting said base and emitter electrodes across said first resistor means, said voltage divider providing a fixed bias for said transistor and such control potential providing a variable bias so that said transistor is forward biased for weak modulated sound signals and is reverse biased for strong modulated sound signals.

References Cited in the file of this patent

UNITED STATES PATENTS

| | | |
|---|---|---|
| 2,497,840 | Seeley | Feb. 14, 1950 |
| 2,528,182 | Sands et al. | Oct. 31, 1950 |
| 2,750,456 | Waldhauer | June 12, 1956 |
| 2,762,873 | Goodrich | Sept. 11, 1956 |
| 2,866,859 | Stanley | Dec. 30, 1958 |